United States Patent
Gil

(10) Patent No.: US 7,285,989 B2
(45) Date of Patent: Oct. 23, 2007

(54) DEVICE FOR DETECTION OF POWER-OFF

(75) Inventor: Myeong-Ho Gil, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 109 days.

(21) Appl. No.: 10/995,431

(22) Filed: Nov. 24, 2004

(65) Prior Publication Data

US 2005/0135130 A1    Jun. 23, 2005

(30) Foreign Application Priority Data

Dec. 17, 2003    (KR) ...................... 10-2003-0092578

(51) Int. Cl.
*H03K 5/153* (2006.01)
*H03L 7/00* (2006.01)

(52) U.S. Cl. ................... 327/77; 327/143; 713/320

(58) Field of Classification Search ............. 713/320, 713/323, 324; 327/77, 142, 143, 198
See application file for complete search history.

(56) References Cited

U.S. PATENT DOCUMENTS

| | | | | |
|---|---|---|---|---|
| 4,037,271 A | * | 7/1977 | Keller ................... 363/21.07 |
| 4,245,150 A | * | 1/1981 | Driscoll et al. ............... 377/32 |
| 4,641,064 A | | 2/1987 | Testin et al. ................ 315/411 |
| 4,820,891 A | * | 4/1989 | Tanaka et al. ............. 219/626 |
| 4,868,729 A | | 9/1989 | Suzuki ..................... 363/21.15 |
| 4,885,673 A | * | 12/1989 | Philippe ................... 363/21.05 |
| 4,888,461 A | * | 12/1989 | Takano et al. ............. 219/716 |
| 5,043,598 A | * | 8/1991 | Maeda et al. .............. 327/538 |
| 5,175,847 A | | 12/1992 | Mellott ....................... 714/12 |
| 5,247,245 A | * | 9/1993 | Nelson ...................... 324/133 |
| 5,305,192 A | * | 4/1994 | Bonte et al. ............. 363/21.16 |
| 5,343,019 A | * | 8/1994 | Nashida et al. ............ 219/216 |
| 5,446,904 A | | 8/1995 | Belt et al. ................... 713/323 |
| 5,455,503 A | * | 10/1995 | Kohler ...................... 323/273 |
| 5,461,297 A | * | 10/1995 | Crawford ................... 320/166 |
| 5,485,111 A | * | 1/1996 | Tanimoto ................... 327/143 |
| 5,511,204 A | | 4/1996 | Crump et al. .............. 713/330 |
| 5,551,043 A | | 8/1996 | Crump et al. .............. 713/323 |
| 5,560,023 A | | 9/1996 | Crump et al. .............. 713/323 |
| 5,592,058 A | * | 1/1997 | Archer et al. .............. 318/254 |
| 5,603,038 A | | 2/1997 | Crump et al. .............. 713/323 |
| 5,757,627 A | * | 5/1998 | Faulk ...................... 363/21.14 |
| 5,758,174 A | | 5/1998 | Crump et al. .............. 713/323 |
| 5,765,004 A | | 6/1998 | Foster et al. ............... 713/323 |

(Continued)

OTHER PUBLICATIONS

Motorola, Inc., Data Sheet for MC34064: Undervoltage Sensing Circuit, 1996, REV 2., pp. 1-5.*

*Primary Examiner*—Kenneth B. Wells
*Assistant Examiner*—Thomas J. Hitunen
(74) *Attorney, Agent, or Firm*—Robert E. Bushnell, Esq.

(57) ABSTRACT

A power-off detection device is formed without use of a photo coupler, which is expensive and occupies a relatively large area. The power-off detection device rectifies AC power, provided as external input power from a power supply device, into DC power, detects the power-off of the external input power from the power supply device as provided to an electronic appliance, provides a power-off detection signal to central control means of the electronic appliance, and enables the central control means to prepare for the power-off, thereby reducing manufacturing cost of the power supply device, and achieving miniaturization thereof.

18 Claims, 3 Drawing Sheets

U.S. PATENT DOCUMENTS

| | | |
|---|---|---|
| 5,903,766 A | 5/1999 | Walker et al. ............... 713/323 |
| 5,933,332 A * | 8/1999 | Honma ........................ 363/20 |
| 6,008,998 A * | 12/1999 | Han ............................. 363/16 |
| 6,081,752 A | 6/2000 | Benson, IV et al. .......... 700/79 |
| 6,119,238 A * | 9/2000 | Jennings et al. ............ 713/300 |
| 6,134,123 A * | 10/2000 | Yamada .................... 363/21.13 |
| 6,223,293 B1 | 4/2001 | Foster et al. ................. 713/300 |
| 6,378,068 B1 | 4/2002 | Foster et al. .................... 713/1 |
| 2004/0156217 A1 * | 8/2004 | Phadke .................... 363/21.16 |

* cited by examiner

DEVICE FOR DETECTION OF POWER-OFF

CLAIM OF PRIORITY

This application makes reference to, incorporates the same herein, and claims all benefits accruing under 35 U.S.C. § 119 from an application for DEVICE FOR DETECTION OF POWER-OFF earlier filed in the Korean Intellectual Property Office on 17 Dec. 2003 and there duly assigned Serial No. 2003-92578.

BACKGROUND OF THE INVENTION

1. Technical Field

The present invention relates to a power-off detection device and, more particularly, to a power-off detection device that enables an electronic appliance to detect the power-off of external input power from a power supply device that supplies DC power to the electronic appliance so as to safely prepare for the power-off.

2. Related Art

A typical power supply device for an electronic appliance provides power by converting AC (Alternating Current) power into DC (Direct Current) power.

The power-off detection device detects a power-off of the external input power that provides the AC power to this typical power supply device, and detects the power-off of the external input power at a certain time before the supply of the DC voltage to the electronic appliance is stopped, so that the central control means of the electronic appliance can complete its work safely without any loss.

The typical power-off detection circuit comprises a number of resistors, a bridge rectifier, a photo coupler, a capacitor and a voltage comparator, and the photo coupler includes a photodiode and a phototransistor.

For this power-off detection circuit, the AC power inputted as external input power from a power supply device is transmitted and rectified via the resistor and the bridge rectifier.

Further, the transmitted and rectified power is applied to the photodiode of the photo coupler, and the photodiode emits light depending on the applied AC power.

Further, the phototransistor of the photo coupler converts the emitted light of the photodiode into a corresponding electrical signal.

The photodiode and the phototransistor of the photo coupler should be kept dielectric for electrical stability between circuits.

Further, the capacitor is charged by a predetermined current of the electrical signal produced by the phototransistor, and the capacitor rectifies the charged current to produce a DC voltage.

When the predetermined current is not provided by the phototransistor, the capacitor discharges through a non-inverting (+) terminal of the voltage comparator, thereby providing a comparison voltage thereto.

A reference voltage is applied to the inverting (−) terminal of the voltage comparator according to the resistance ratio between voltage dividing resistors while the a comparison voltage is applied by the capacitor to the non-inverting (+) terminal of the voltage comparator.

Therefore, the voltage comparator compares the reference voltage with the comparison voltage, and when there is a difference between the two voltages, a power-off detection signal is outputted to an output terminal through a pull-up resistor during a predetermined time period.

That is, when the comparison voltage value is not equal to the established reference voltage in the voltage comparator, a predetermined power-off detection signal is outputted through a pull-up resistor.

The output terminal of the voltage comparator, which is the output terminal of the power-off detection circuit, is connected to central control means of the electronic appliance, and when the power-off detection signal is received from the output terminal of the power-off detection circuit, the central control means completes its work safely while primary power continues to power-off.

In preparation for the power-off of the primary power, the central control means can store, in storage means, information as to currently running or pending work, and can complete its work safely before the supply of DC power ceases.

This typical power-off detection circuit has to use the photo coupler having the photodiode and the phototransistor to keep dielectric relationship between circuits.

However, there is a problem in that the cost of manufacturing the power supply device increases because the photo coupler is expensive.

Further, when designing the power supply device, if a photo coupler is employed, it is difficult to guarantee a safe distance between a primary circuit and a secondary circuit, and to make the appliance smaller since the area occupied by the photo coupler becomes large.

The following patents are considered to be generally pertinent to the present invention, but are burdened by many of the disadvantages set forth above: U.S. Pat. No. 6,378,068 to Foster et al., entitled SUSPEND/RESUME CAPABILITY FOR A PROTECTED MODE MICROPROCESSOR, issued on Apr. 23, 2002; U.S. Pat. No. 6,223,293 to Foster et al., entitled SUSPEND/RESUME CAPABILITY FOR A PROTECTED MODE MICROPROCESSOR, issued on Apr. 24, 2001; U.S. Pat. No. 6,081,752 to Benson IV et al., entitled COMPUTER SYSTEM HAVING POWER SUPPLY PRIMARY SENSE TO FACILITATE PERFORMANCE OF TASKS AT POWER OFF, issued on Jun. 27, 2000; U.S. Pat. No. 5,765,004 to Foster et al., entitled SUSPEND/RESUME CAPABILITY FOR A PROTECTED MODE MICROPROCESSOR, issued on Jun. 9, 1998; U.S. Pat. No. 5,603,038 to Crump et al., entitled AUTOMATIC RESTORATION OF USER OPTIONS AFTER POWER LOSS, issued on Feb. 11, 1997; U.S. Pat. No. 5,560,023 to Crump et al., entitled AUTOMATIC BACKUP SYSTEM FOR ADVANCED POWER MANAGEMENT, issued on Sep. 24, 1996; U.S. Pat. No. 5,551,043 to Crump et al., entitled STANDBY CHECKPOINT TO PREVENT DATA LOSS, issued on Aug. 27, 1996; U.S. Pat. No. 5,511,204 to Crump et al., entitled PERFORMING SYSTEM TASKS AT POWER-OFF USING SYSTEM MANAGEMENT INTERRUPT, issued on Apr. 23, 1996; U.S. Pat. No. 5,175,847 to Mellott, entitled COMPUTER SYSTEM CAPABLE OF PROGRAM EXECUTION RECOVERY, issued on Dec. 29, 1992; U.S. Pat. No. 4,641,064 to Testin et al., entitled TELEVISION POWER SUPPLY SHUTDOWN CIRCUIT, issued on Feb. 3, 1987; U.S. Pat. No. 5,903,766 to Walker et al., entitled SUSPEND/RESUME CAPABILITY FOR A PROTECTED MODE MICROPROCESSOR, issued on May 11, 1999; U.S. Pat. No. 5,758,174 to Crump et al., entitled COMPUTER SYSTEM HAVING A PLURALITY OF STORED SYSTEM CAPABILITY STATES FROM WHICH TO RESUME, issued on May 26, 1998; U.S. Pat. No. 5,446,904 to Belt et al., entitled SUSPEND/RESUME CAPABILITY FOR A PROTECTED MODE MICROPRO- CESSOR, issued on Aug. 29, 1995; and U.S. Pat. No. 4,868,729 to Suzuki, entitled POWER SUPPLY UNIT, issued on Sep. 19, 1989.

SUMMARY OF THE INVENTION

It is, therefore, an object of the present invention to provide a power-off detection device for detecting the power-off of external power to an electronic appliance using a simple circuit and without employing a photo coupler in the power supply device that supplies a predetermined DC voltage to the electronic appliance.

To achieve the foregoing object, a power-off detection device according to an aspect of the present invention comprises: a detection unit for generating an induced current as a result of an AC current provided as external input power from a power supply device; a voltage supply unit for converting the induced current generated by the detection unit into a corresponding predetermined voltage so as to provide a detection voltage; and a voltage comparison unit for comparing the detection voltage provided by the voltage supply unit and an established reference voltage, and for providing a power-off detection signal when there is a difference between the two voltages.

Preferably, the detection unit of the power-off detection device according to the present invention is a transformer.

Further, the transformer according to the present invention includes a first coil that forms a magnetic flux according to the AC current provided as external power from the power supply device, and a second coil that generates an induced current as a result of the magnetic flux formed in the first coil.

Preferably, the voltage supply unit of the power-off detection device according to the present invention includes: a diode having an anode terminal connected to one end of the second coil; and a capacitor having one end connected to a cathode terminal of the diode and another end connected to another end of the second coil.

Preferably, the voltage comparison unit of the power-off detection device according to the present invention is an operational amplifier.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

A preferred embodiment of the present invention will be described hereinbelow with reference to the accompanying drawings. In the following description, well-known functions or arrangements are not described in detail since they would obscure the invention in unnecessary detail.

Figure 1:
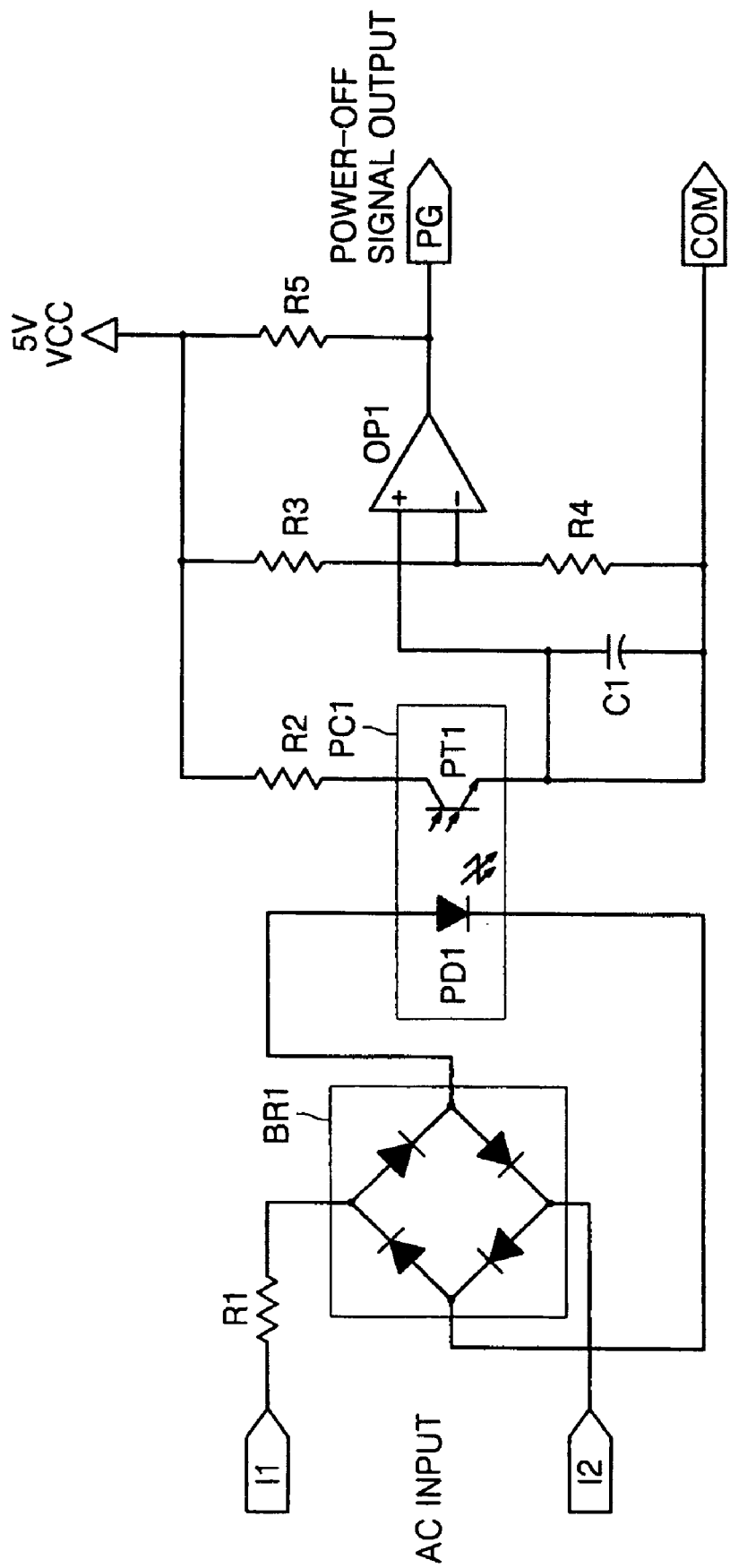
FIG. 1 is a diagram of a power-off detection circuit of a typical power supply device.

FIG. 1 is a diagram of a power-off detection circuit of a typical power supply device.

Referring to FIG. 1, the typical power-off detection circuit comprises a number of resistors R1 to R5, a bridge rectifier BR1, a photo coupler PC1, a capacitor C1 and a voltage comparator OP1, and the photo coupler PC1 includes a photodiode PD1 and a phototransistor PT1.

For this power-off detection circuit, the AC power inputted as external input power from a power supply device (not shown) is transmitted and rectified via the resistor R1 and the bridge rectifier BR1.

Further, the transmitted and rectified power is applied to the photodiode PD 1 of the photo coupler PC1, and the photodiode PD1 emits light depending on the applied AC power.

Further, the phototransistor PT1 of the photo coupler PC1 converts the light emitted from the photodiode PD1 into a corresponding electrical signal.

The photodiode PD1 and the phototransistor PT1 of the photocoupler PC1 should be kept dielectric for electrical stability between circuits.

Further, the capacitor C1 is charged by a predetermined current according to the electrical signal produced by the photo coupler PC1, into which the phototransistor PT1 converts the light, and rectifies the charged current to the DC voltage.

Further, when the predetermined current is not provided by the phototransistor PT, the capacitor C1 discharges through the non-inverting (+) terminal of the voltage comparator OP1 as a comparison voltage.

A reference voltage is applied to the inverting (−) terminal of the voltage comparator OP1 according to the resistor ratio between voltage dividing resistors R3, R4, and a comparison voltage is applied by the capacitor C1 to the non-inverting (+) terminal of voltage comparator OP1.

Therefore, the voltage comparator OP1 compares the reference voltage with the comparison voltage, and when there is a difference between the two voltages, a power-off detection signal is outputted to an output terminal PG through a pull-up resistor R5 during a predetermined period.

That is, when the comparison voltage value is not equal to the established reference voltage in the voltage comparator OP1, a predetermined power-off detection signal is outputted through a pull-up resistor R5.

The output terminal PG is connected to central control means (not shown) of the electronic appliance, and when the power-off detection signal is received from the output terminal PG of the power-off detection circuit, the central control means completes its work safely while primary power continues to power-off.

Here, in preparation for the power-off of the primary power, the central control means can store, in storage means (not shown), information as to the currently running or pending work, and can complete the work safely before the supply of DC power is ceased.

This typical power-off detection circuit has to use the photo coupler PC1, which includes the photodiode PD1 and the phototransistor PT1, to keep dielectric between circuits.

However, there is a problem in that the cost of manufacturing the power supply device increases because the photo coupler PC1 is expensive.

Further, when designing the power supply device, if the photo coupler PC1 is employed, it is difficult to guarantee a safe distance between a primary circuit and a secondary circuit, and to make the appliance smaller since the occupying area of the photo coupler PC1 becomes large.

Figure 2:
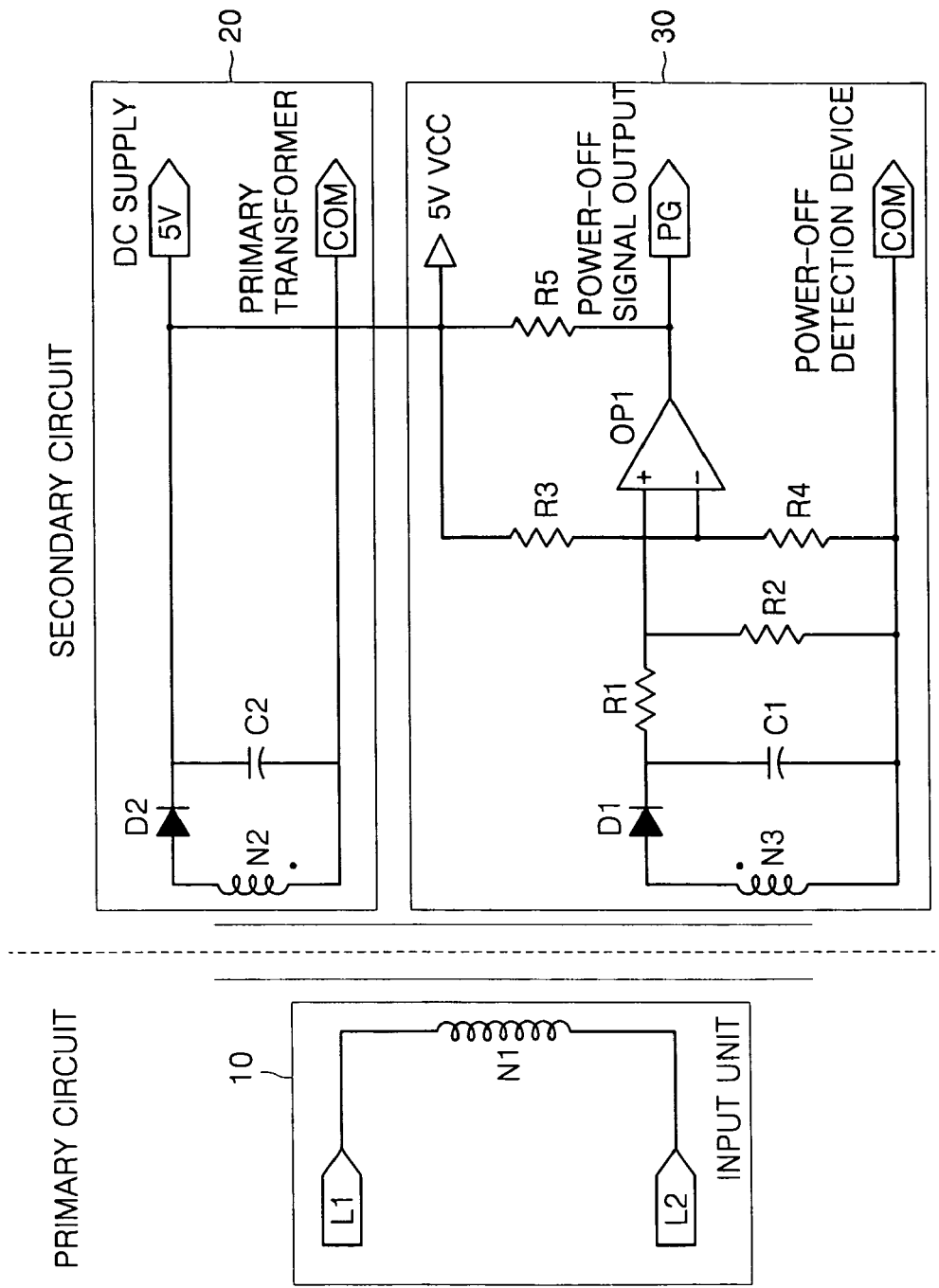
FIG. 2 is an internal circuit diagram for illustrating a schematic configuration of a power-off detection circuit of an electronic appliance according to a preferred embodiment of the present invention.

FIG. 2 is an internal circuit diagram for illustrating a schematic configuration of a power-off detection circuit of an electronic appliance according to a preferred embodiment of the present invention.

Referring to FIG. 2, the power supply device according to the present invention comprises: an input unit 10 in which an AC current is inputted as external input power from a power supply device (not shown); a primary transformer 20 which rectifies the AC current inputted through the input unit 10, and which provides a predetermined DC voltage to the electronic appliance; and a power-off detection device 30 which detects the power-off of the external input power from the power supply device (not shown) which provides the AC current to the input unit 10.

The power-off detection device 30 can be either included in the primary transformer 20 or separately arranged. The detailed description of the present invention will now be described in terms of a separate arrangement of the power-off detection device 30.

The input unit 10 includes a first coil N1 that forms a magnetic flux as a result of the AC power provided as external input power from the power supply device (not shown).

The primary transformer 20 includes a second coil N2 for generating an induced 11 current induced as a result of the magnetic flux formed in the first coil N1, and a second diode D2 and a second capacitor C2 for smoothing and rectifying the current flowing through the second coil N2 so as to provide a predetermined DC voltage to the electronic appliance.

In the primary transformer 20, an anode terminal of the second diode D2 is connected to one end of the second coil N2 corresponding to the first coil N1 of the primary input unit 10, and the second capacitor C2 is connected in parallel with the second coil N2, and is connected to a cathode terminal of the second diode D2.

The second diode D2 prevents an inverse current from flowing in the primary transformer 20. The second capacitor C2 charges/discharges as a result of the induced current flowing through the second coil N2, and also rectifies the AC power provided through the input unit 10 into DC power for provision to the electronic appliance.

The power-off detection device 30 comprises a third coil N3 for generating an induced current according to the magnetic flux of the first coil N1, a first diode D1 and a first capacitor C1 for smoothing and rectifying the current that flows through the third coil N3 so as to provide a detection voltage to a voltage comparator OP1, and voltage dividing resistors R3, R4 for providing a reference voltage to the voltage comparator OP1.

Preferably, the voltage comparator OP1 employs an operational amplifier.

The first and second resistors R1, R2 of power-off detection device 30 serve to divide the detection voltage rectified at the first diode D1 and the first capacitor C1 so as to apply the divided voltage to the voltage comparator OP1.

The third resistor R3 and the fourth resistor R4 apply the predetermined DC voltage, which the primary transformer 20 provides to the electronic appliance, to the voltage comparator OP1 as a reference voltage.

The second coil N2 and the third coil N3 are wound in opposite directions, and it is desirable that the power-off detection device 30 detect the power-off of the external input power while the primary transformer 20 performs smoothing and rectifying in order to provide the predetermined DC voltage to the electronic appliance.

For this power-off detection device 30, an anode terminal of the first diode D1 is connected to one end of the third coil N3 corresponding to the first coil N1 of the input unit 10, and a cathode terminal of the first diode D1 is connected one end of the first capacitor C1, which is connected in parallel with the third coil N3.

One end of the first resistor R1 is connected to the cathode terminal of the first diode D1, and the other end of the first resistor R1 is connected in series with the second resistor R2, which is connected in parallel with the first capacitor C1.

The other end of the first resistor R1, and an end of the second resistor R2 connected to the first resistor R1, are also connected to a non-inverting (+) terminal of the voltage comparator OP1.

The detection voltage discharged from the first capacitor C1 is applied to the non-inverting (+) terminal of the voltage comparator OP1 depending on the ratio of the resistance values of the first resistor R1 and the second resistor R2.

Further, one end of a fifth resistor R5 is connected to the voltage output terminal that provides the predetermined DC voltage to the electronic appliance, and the other end of the fifth resistor R5 is connected to the output terminal of the voltage comparator OP1.

In addition, one end of the third resistor R3 is connected to the output terminal of the primary transformer 20, and the other end of the third resistor R3 is connected to one end of the fourth resistor R4.

The one end of the fourth resistor R4 connected to the other end of the third resistor R3 is also connected to an inverting (−) terminal of the voltage comparator OP1.

The first diode D1 of this power-off detection device 30 prevents an inverse current from flowing in the power-off detection device 30. The first capacitor C1 is connected in parallel with the third coil N3, and smoothes and rectifies the current that flows through the first diode D1 so as to provide the detection voltage.

As a result of the connection of the first resistor R1 and the second resistor R2, the detection voltage discharged from the first capacitor C1 is applied to the non-inverting (+) terminal of the voltage comparator OP1 as a detection voltage depending on the ratio of the resistance values of resistors R1 and R2.

Preferably, the ratio of the resistance values of the first resistor R1 and the second resistor R2, based on which the detection voltage is applied to the voltage comparator OP1, and the ratio of the resistance values of the third resistor R3 and the fourth resistor R4, based on which the reference voltage is applied to the voltage comparator OP1, are set such that the detection voltage value and the reference voltage value, applied to the voltage comparator OP1 in a state where power-off is not yet generated in the external power supply, are equal.

Further, as a result of the connection of the third resistor R3 and the fourth resistor R4, the predetermined DC voltage provided to the electronic appliance through the output terminal of the primary transformer 20 is applied to the inverting (−) terminal of the voltage comparator OP1 as a reference voltage, depending on the ratio of the resistance values of resistors R3 and R4.

The voltage comparator OP1 compares the detection voltage applied to the non-inverting terminal and the reference voltage applied to the inverting terminal, and when there is a difference between these voltage values, a power-off detection signal corresponding to the difference is outputted to the output terminal of power-off detection device 30.

The fifth resistor R5 pulls up a power-off detection signal, which the voltage comparator OP1 outputs, by as much as the predetermined DC voltage provided from the primary transformer 20 to the electronic appliance so as to transmit the power-off detection signal to the central control means of the electronic appliance.

A method of detecting the power-off of a power supply device according to the present invention will now be described.

First, in the first coil N1 of the input unit 10 arranged at the primary circuit side, a magnetic flux is formed according to the AC power provided as the external input power, and in the second coil N2 of the primary transformer 20 arranged at the secondary circuit side, an induced current is generated according to the winding ratio N1:N2 of the first coil N1 and the second coil N2.

Further, if current flows through the second coil N2 in a direction from the anode to the cathode of the second diode D2, the second diode D2 passes the current, and the second capacitor C2 is charged with the applied current so as to rectify to the DC voltage.

On the other hand, if the current flows through the second coil N2 in a direction from the cathode to the anode of the second diode D2, the second diode D2 does not pass the current, and the second capacitor C2 discharges the DC current rectified depending on the charged current so as to provide a predetermined DC voltage to the electronic appliance.

Based on the designed capacitance of the second capacitor C2, a power-off retention time is determined, during which time as measured from a time when the power-off is generated in the external input power supply device, the primary transformer 20 provides the predetermined DC voltage.

Meanwhile, in the third coil N3 of the power-off detection device 30, an induced current is generated according to the winding ratio with the first coil, that is, N1:N3.

Since the third coil N3 is wound in a reverse direction with respect to the second coil N2, current flows in a direction opposite to the direction of current flowing through the second coil N2.

Furthermore, if the current flows through the third coil N3 in a direction from the anode to the cathode of the first diode D1, the first diode D1 passes the current, and the first capacitor C1 charges so as to rectify the DC voltage. The voltage rectified at the first capacitor C1 becomes a detection voltage.

On the other hand, if the current flows through the third coil N3 in a direction from the cathode to the anode of the first diode D1, the first diode D1 does not pass the current, and the first capacitor C1 discharges the detection voltage according to the charged current.

Furthermore, the voltage discharged from the first capacitor C1 is applied to the non-inverting terminal of the voltage comparator OP1 as a detection voltage according to the ratio of the resistance values of the first resistor R1 and the second resistor R2, and the reference voltage is applied to the inverting terminal according to a ratio of the resistance values of the third resistor R3 and the fourth resistor R4 connected to the output terminal, through which the primary transformer 20 provides the predetermined DC voltage to the electronic appliance.

The voltage comparator OP1 compares the detection voltage applied to the non-inverting (+) terminal and the reference voltage applied to the inverting (−) terminal, and when there is a difference between these voltages, the power-off detection signal corresponding to the difference is outputted to the output terminal.

Furthermore, the fifth resistor R5 pulls up the power-off detection signal so that the signal corresponds to the predetermined DC voltage, which the primary transformer 20 provides to the electronic appliance and transmits to the central control means of the electronic appliance.

It is desirable that the voltage dividing resistors R3 and R4, the first resistor R1, the second resistor R2, and the capacitor C1 be designed such that the reference voltage value is equal to the detection voltage value.

When the power-off occurs in the external input power, a magnetic flux is not formed at the first coil N1 of the input unit 10 so that the induced current is not generated at the second coil N2 of the primary transformer 20, and the second capacitor C2 provides the current charged according to its capacitance value to the electronic appliance as a predetermined DC voltage during a predetermined period.

During the power-off retention time, as measured from the time that power-off occurs, the primary transformer 20 continue to provide the DC voltage charged into the second capacitor C2, and this power-off retention time is determined by the capacitance of the second capacitor C2. That is, when the capacitance of the second capacitor is increased, the power-off retention time grows longer, and when the capacitance of the second capacitor is reduced, the power-off retention time grows shorter.

Further, induced current is not generated, even in the third coil N3 of the power-off detection device 30, so that the detection voltage is not applied to the non-inverting (+) terminal of the voltage comparator OP1.

The second coil N2 and the third coil N3 are wound in reverse directions relative to each other so that, for example, if the second capacitor C2 of the primary transformer 20 rectifies the current, the first capacitor C1 of the power-off detection device 30 discharges the detection voltage.

Therefore, the power-off detection device 30 can detect the power-off of the external input power at the same time that the second capacitor C1 of the primary transformer 20 discharges the DC voltage.

Furthermore, when there is a difference between the reference voltage and the detection voltage applied to the voltage comparator OP1, that is, when the power-off occurs in the external input power, induced current is not generated in the third coil N3 so that, if the detection voltage is not applied to the voltage comparator OP1, the voltage comparator OP1 outputs to the output terminal the power-off detection signal according to the difference between the detection voltage and the reference voltage.

The fifth resistor R5, connected to the output terminal of the voltage comparator OP1, pulls up the power-off detection signal outputted to the output terminal so as to correspond to a predetermined DC voltage that the primary transformer 20 provides to the electronic appliance, and then transmits the power-off detection signal to the central control means of the electronic appliance.

Figure 3:
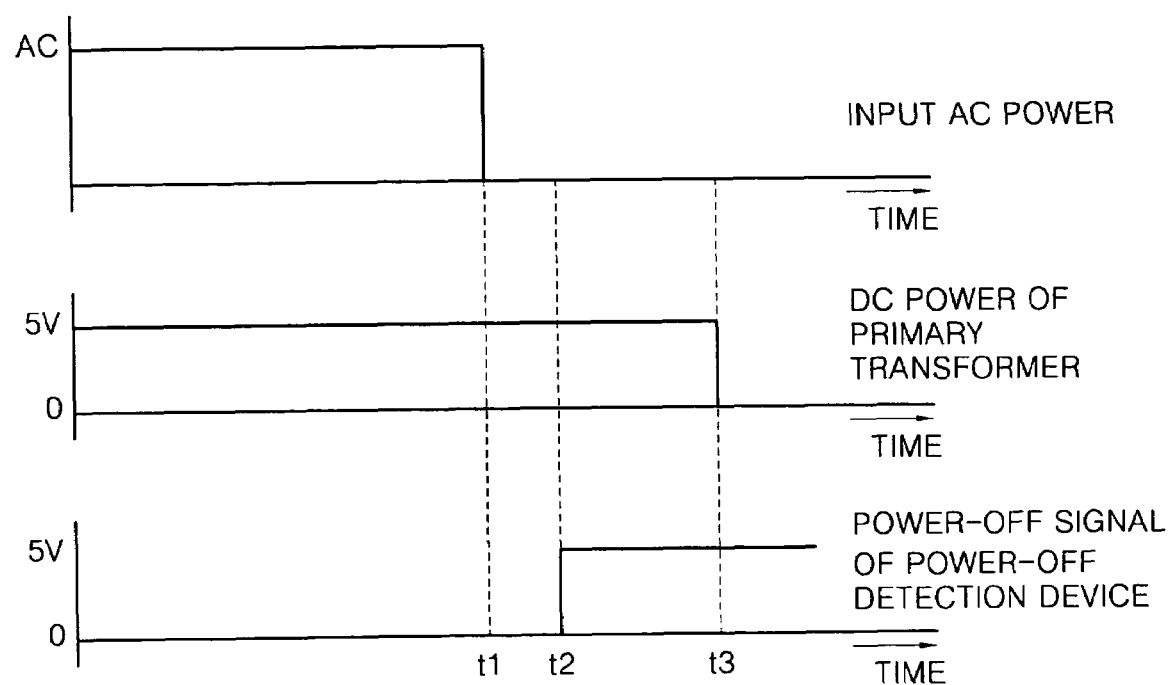
FIG. 3 is a timing diagram illustrating a signal of a power supply device according to the present invention.

FIG. 3 is a timing diagram illustrating a signal of a power supply device according to the present invention.

As shown in FIG. 3, when the power-off of the external input power occurs at time t1, the power-off detection device 30 detects the power-off of the external input power at time t2, and transmits the power-off detection signal to the central control means of the electronic appliance within the power-off retention time t1-t3 of the primary transformer 20.

That is, the first capacitor C1 of the power-off detection device 30 has a much smaller capacitance than the second capacitor C2 of the primary transformer 20 so that it has a faster charge/discharge period than the second capacitor C2.

Therefore, the power-off detection device 30 detects the power-off of the external input power within the predetermined period t1-t3, or the power-off retention time during which the primary transformer 20 provides the DC voltage, so that it can provide the power-off detection signal to the central control means of the electronic appliance.

Therefore, the central control means of the electronic appliance receives the power-off detection signal from the power-off detection device 30 before the DC voltage supplied from the primary transformer 20 ceases, and stores information as to currently running or pending work, or safely stops the work.

Additionally, since the second coil N2 of the primary transformer 20 and the third coil N3 of the power-off detection device 30 are wound in reverse directions relative to each other, the phase of each current that flows through the second coil N2 and the third coil N3 is different.

Therefore, during the period when the second capacitor C2 is charged, the first capacitor C1 is discharged, so that the power-off detection device 30 detects the power-off of the external input power during the power-off retention period t1-t3 during which the second capacitor C2 discharges the DC voltage, thereby allowing the power-off detection signal to be provided to the central control means during a predetermined period.

The power-off retention time of the primary transformer 20 is determined by the capacitance of the second capacitor C2, and it is thus desirable to make the capacitance of the second capacitor C2 much larger than that of the first capacitor C1 so that the power-off detection device 30 detects the power-off of the external input power within the power-off retention time t1-t3 of the primary transformer 20, thereby providing the power-off detection signal.

Although the present invention has been described in terms of a specific embodiment, it will be apparent to those skilled in the art that a variety of modifications and changes can be made without departing from the scope of the present invention, and it is natural that these modifications and changes be included in the following claims.

As described above, according to the present invention, a photo coupler is not employed in the device for detecting the power-off that occurs in the power supply device of the electronic appliance, thereby facilitating a design which provides a safe distance between the first circuit and the second circuit, and minimizing the occupying area of the voltage detection device so as to enable design of a miniaturized power supply device.

Further, a low cost device can be used instead of the expensive photo coupler, thereby minimizing the unit price of the power supply device.

Although preferred embodiments of the present invention have been described, it will be understood by those skilled in the art that the present invention should not be limited to the described preferred embodiments. Rather, various changes and modifications can be made within the spirit and scope of the present invention, as defined by the following claims.

What is claimed is:

1. A device for detecting a power-off of external input power from a power supply device, comprising:
    a detection unit for generating an induced current in response to an AC current provided by the power supply device;
    a voltage supply unit for converting the induced current generated by the detection unit into a detection voltage; and
    a voltage comparison unit for comparing the detection voltage provided by the voltage supply unit and a reference voltage, and for providing a power-off detection signal when there is a difference between the detection voltage and the reference voltage;
    wherein the detection unit comprises a transformer which includes a first coil which forms a magnetic flux in response to the AC current provided by the power supply device, a second coil which is responsive to the magnetic flux formed by the first coil for generating an induced current which is smoothed and rectified so as to provide a DC voltage, via an output circuit, to an electronic appliance, and a third coil which generates the induced current in response to the magnetic flux formed by the first coil;
    said device further comprising a voltage divider connecting the output circuit to an inverting input of the voltage comparison circuit for providing a divided voltage thereto as the reference voltage; and
    wherein the voltage comparison circuit provides the power-off detection signal via the output circuit, to the electronic appliance, whereby the electronic appliance is safely prepared for power-off.

2. The device according to claim 1, wherein the third coil is wound in a direction opposite to a direction in which the second coil is wound.

3. The device according to claim 1, wherein the voltage supply unit includes a diode having an anode terminal connected to one end of the third coil, and a capacitor having one end connected to a cathode terminal of the diode and another end connected to another end of the third coil.

4. The device according to claim 1, wherein the reference voltage is derived from the DC voltage supplied.

5. The device according to claim 1, wherein the voltage comparison unit comprises an operational amplifier.

6. The device according to claim 1, further comprising an additional voltage divider connecting the detection unit to a non-inverting input of the voltage comparison unit.

7. A device for detecting a power-off of an external input power from a power supply device, comprising:
    a transformer for generating an induced current in response to AC power provided by the power supply device;
    a voltage supply unit for smoothing and rectifying the induced current generated by the transformer to provide a detection voltage; and
    a voltage comparison unit for comparing the detection voltage provided by the voltage supply unit and a reference voltage, and for providing a power-off detection signal when there is a difference between the detection voltage and the reference voltage;
    wherein the transformer comprises a first coil which forms a magnetic flux in response to the AC current provided by the power supply device, a second coil which is responsive to the magnetic flux formed by the first coil for generating an induced current which is smoothed and rectified so as to provide a DC voltage, via an output circuit, to an electronic appliance, and a third coil which generates the induced current in response to the magnetic flux formed by the first coil;
    said device further comprising a voltage divider connecting the output circuit to an inverting input of the voltage comparison circuit for providing a divided voltage thereto as the reference voltage; and wherein the voltage comparison circuit provides the power-off detection signal via the output circuit, to the electronic appliance, whereby the electronic appliance is safely prepared for power-off.

8. The device according to claim 7, wherein the third coil is wound in a direction opposite to a direction in which the second coil is wound.

9. The device according to claim 7, wherein the voltage supply unit includes a diode having an anode terminal connected to one end of the third coil, and a capacitor having one end connected to a cathode terminal of the diode and another end connected to another end of the third coil.

10. The device according to claim 7, wherein the reference voltage is derived from the DC voltage supplied to the electronic appliance.

11. The device according to claim 7, wherein the voltage comparison unit comprises an operational amplifier.

12. The device according to claim 7, further comprising an additional voltage divider connecting the transformer to a non-inverting input of the voltage comparison unit.

13. The device according to claim 1, wherein the output circuit comprises:
   a diode having an anode connected to a first end of the second coil, and a cathode; and
   a capacitor connected between the cathode of the diode and a second end of the second coil;
   wherein interconnection of the cathode of the diode and the capacitor forms a junction; and
   wherein the voltage divider comprises a first resistor connected between the inverting input of the voltage comparison circuit and the junction, and a second resistor connected between the first resistor and the inverting input of the voltage comparison circuit, on one side, and the third coil, on another side.

14. The device according to claim 13, wherein an output of the voltage comparison circuit is connected, via a third resistor, to the junction.

15. The device according to claim 1, wherein the output circuit comprises:
   a diode having an anode connected to a first end of the second coil, and a cathode; and
   a capacitor connected between the cathode of the diode and a second end of the second coil;
   wherein interconnection of the cathode of the diode and the capacitor forms a junction; and
   wherein an output of the voltage comparison circuit is connected, via a resistor, to the junction.

16. The device according to claim 7, wherein the output circuit comprises:
   a diode having an anode connected to a first end of the second coil, and a cathode; and
   a capacitor connected between the cathode of the diode and a second end of the second coil;
   wherein interconnection of the cathode of the diode and the capacitor forms a junction; and
   wherein the voltage divider comprises a first resistor connected between the inverting input of the voltage comparison circuit and the junction, and a second resistor connected between the first resistor and the inverting input of the voltage comparison circuit, on one side, and the third coil, on another side.

17. The device according to claim 16, wherein an output of the voltage comparison circuit is connected, via a third resistor, to the junction.

18. The device according to claim 7, wherein the output circuit comprises:
   a diode having an anode connected to a first end of the second coil, and a cathode; and
   a capacitor connected between the cathode of the diode and a second end of the second coil;
   wherein interconnection of the cathode of the diode and the capacitor forms a junction; and
   wherein an output of the voltage comparison circuit is connected, via a resistor, to the junction.

* * * * *